United States Patent

Dorri

Patent Number: 5,677,854
Date of Patent: Oct. 14, 1997

[54] METHOD FOR PASSIVELY SHIMMING A MAGNET

[75] Inventor: Bizhan Dorri, Clifton Park, N.Y.

[73] Assignee: General Electric Company, Schenectady, N.Y.

[21] Appl. No.: 373,996

[22] Filed: Jan. 17, 1995

[51] Int. Cl.$^6$ .............................. G01R 33/24; G01V 3/00
[52] U.S. Cl. .................... 364/578; 324/320; 335/301
[58] Field of Search ........................ 364/578; 335/216, 335/298, 301; 324/318, 319, 320

[56] References Cited

U.S. PATENT DOCUMENTS

| | | | |
|---|---|---|---|
| 4,698,611 | 10/1987 | Vermilyea | 335/301 |
| 4,771,244 | 9/1988 | Vermilyea | 324/320 |
| 4,853,663 | 8/1989 | Vermilyea | 335/301 |
| 4,990,877 | 2/1991 | Benesch | 335/301 |
| 5,003,266 | 3/1991 | Palkovich et al. | 324/320 |
| 5,045,794 | 9/1991 | Dorri et al. | 324/320 |
| 5,304,934 | 4/1994 | Laskaris et al. | 324/318 |
| 5,317,298 | 5/1994 | Dorri et al. | 335/301 |
| 5,343,183 | 8/1994 | Shimada et al. | 335/301 |
| 5,389,909 | 2/1995 | Havens | 324/320 |
| 5,418,462 | 5/1995 | Breneman et al. | 324/320 |
| 5,431,165 | 7/1995 | Sellers | 324/318 |
| 5,439,543 | 8/1995 | Dorri et al. | 156/184 |
| 5,446,434 | 8/1995 | Dorri et al. | 335/301 |
| 5,517,118 | 5/1996 | Crowley et al. | 324/309 |
| 5,532,597 | 7/1996 | McGinley et al. | 324/319 |
| 5,539,366 | 7/1996 | Dorri et al. | 324/318 |

OTHER PUBLICATIONS

Concurrently filed U.S. Patent Application RD-24059, of Bizhan Dorri, "Method for Passively Shimming an Open Magnet".

U.S. Patent Application Serial No. 08/183,375, filed Jan. 19, 1994, of Bizhan Dorri, et al. "Apparatus and Method for Passive Shimming of a Superconducting Magnet Which Images Human Limbs".

U.S. Patent Application Ser. No. 08/148,250, filed Nov. 8, 1993, of T.J. Havens, "Open Architecture Magnetic Resonance Imaging Passively Shimmed Superconducting Magnaet Assembly".

See "Background of the Invention" of the present patent application.

*Primary Examiner*—Kevin J. Teska
*Assistant Examiner*—Tyrone V. Walker
*Attorney, Agent, or Firm*—Douglas E. Erickson; Marvin Snyder

[57] ABSTRACT

A method for passively shimming a magnet having a magnetic field with an inhomogeneity and having N possible passive shim locations. The magnetic field is mapped. A function is defined related to the mapped field as affected by N shim variables of positive shim strength and M shim variables of negative shim strength. A computer optimization code is run which calculates the positive strengths of the N shim variables and the negative strengths of the M shim variables which minimizes the defined function. Positive strengths of passive shims are added to the magnet corresponding to the calculated positive strengths of the N shim variables and positive strengths of passive shims are removed from the magnet corresponding to the calculated negative strengths of the M shim variables.

10 Claims, 2 Drawing Sheets

METHOD FOR PASSIVELY SHIMMING A MAGNET

BACKGROUND OF THE INVENTION

The present invention relates generally to shimming of magnets, and more particularly to passively shimming a magnet.

Magnets include, but are not limited to, closed and open magnet designs. Closed magnets have a single magnetic assembly with a bore in which is located the working magnetic field volume. Open magnets have two spaced-apart magnetic assemblies with generally coaxially aligned bores and a working magnetic field volume located in the open space between the magnetic assemblies. Open magnets have advantages in certain applications such as in MRI (magnetic resonance imaging) medical imaging where the open space helps the patient overcome any feelings of claustrophobia that may be experienced in a closed magnet design. Real magnets have an inhomogeneity of the magnetic field in the working magnetic field volume due to manufacturing tolerances and site conditions. In many applications, the open or closed magnet must be shimmed to reduce the inhomogeneity of the magnetic field in the working magnetic field volume to within a predetermined specification. For example, an open MRI magnet whose magnetic assemblies are superconductive coil assemblies must be shimmed to reduce the inhomogeneity of the magnetic field in its working magnetic field volume, which is its imaging volume, to within a few parts per million for use in medical diagnosis.

Known methods for shimming closed superconductive MRI magnets include active shimming and passive shimming. Active shimming typically requires a complex arrangement of superconductive shimming coils. Passive shimming typically involves the placement of carbon steel shims of calculated thickness in the bore of the closed magnet at calculated locations on the inside diameter of the superconductive coil assembly. The thickness and location of the shims are determined through use of a computer shim code, as is known to those skilled in the art, which calculates adding shims to reduce the inhomogeneity of the mapped magnetic field in the imaging volume of the closed MRI magnet. The calculated shims are added to the magnet, the magnetic field of the magnet is again mapped, and the computer shim code is again run. This process is repeated until the inhomogeneity of the measured magnetic field in the imaging volume is reduced to within a predetermined specification. The repetitive nature of the shimming process is the result of the computer shim code being only an approximation of the real magnet.

Typically the shimming process starts with approximating the measured magnetic field in the imaging volume in terms of a Legendre polynomial expansion, as is known to those skilled in the art. For closed superconductive MRI magnets having magnetic field inhomogeneities, a typical Legendre polynomial approximation of the magnetic field within the working magnetic field volume would include Legendre polynomial terms (harmonics) up to order 8 and degree 8, including 2,0 Legendre polynomial harmonics (i.e., the Legendre polynomial term of order 2 and degree 0). A typical computer shim code (as mentioned in the previous paragraph) defines a function related to the measured magnetic field inhomogeneity as affected by the addition of shims and then calculates, in an iterative manner, the thickness and location of shims to be added to the magnet which minimizes the defined function.

Applicant encountered problems in trying to passively shim open magnets. Shims could not be placed in the open space between the magnetic assemblies, and a typical open magnet could only be conventionally shimmed from a peak-to-peak inhomogeneity of about 1,000 ppm (parts-per-million) to about 400 ppm. Applicant discovered that adding shims only to the magnetic assemblies could not create positive 2,0 Legendre polynomial harmonics which were needed to compensate for negative 2,0 Legendre polynomial harmonics created when shims were added to reduce inhomogeneities of other harmonics. Open magnets were designed by others to have built-in positive 2,0 Legendre polynomial harmonics such as by having a larger separation between the magnetic assemblies or by initially adding full shim trays and then removing some shims to create positive 2,0 Legendre polynomial harmonics. However, when Applicant used a typical shimming computer code to add shims to reduce the inhomogeneity of the mapped magnetic field of such a positive-2,0-biased open magnet, it was found that such open magnet could only be shimmed from a peak-to-peak inhomogeneity of about 1,000 ppm (parts-per-million) to about 50 ppm. Applicant also encountered limiting inhomogeneities when passively shimming closed magnets using conventional passive shimming techniques. What is needed is an improved method for passively shimming open, closed, and other types of magnets to even lower levels of inhomogeneity.

SUMMARY OF THE INVENTION

It is an object of the invention to provide a method for passively shimming a magnet.

The method of the invention is for passively shimming a magnet having a magnetic field with an inhomogeneity and having N possible passive shim locations. The method includes the following steps. In step (a), the magnetic field is mapped. In step (b), a function is defined which is related to the inhomogeneity of the mapped magnetic field of step (a) as affected by N shim variables each having a positive shim strength and each located at a corresponding one of the N possible passive shim locations and as affected by M shim variable each having a negative shim strength and each located at a corresponding one of the N possible passive shim locations, wherein N is at least equal to M. In step (c), a computer optimization code is run which calculates the positive strengths of the N shim variables and the negative strengths of the M shim variables which minimizes the defined function. In step (d), positive strengths of passive shims corresponding to the positive strengths of the N shim variables calculated from step (c) are added to the magnet and positive strengths of passive shims corresponding to the negative strengths of the M shim variables calculated from step (c) are removed from the magnet.

In a preferred embodiment of the method of the invention, M is the number of occupied passive shim locations having previously-added passive shims out of the N possible passive shim locations, and the M shim variables are each located at a corresponding one of the M occupied passive shim locations.

Several benefits and advantages are derived from the invention. Applicant performed analytical calculations which showed that by having the defined function to be minimized include positive and negative shim strengths, passive shims could be added and removed during the same step of the method which resulted in low levels of inhomogeneity. For example, a typical open magnet having positive 2,0 Legendre polynomial harmonics could have its peak-topeak magnetic field inhomogeneity reduced from about 1,000 ppm to about 50 ppm using conventional shim methods. This compares to reducing the inhomogeneity of such open magnet, based on analytical calculations, from about 1,000 ppm to about 6 ppm with the method of the invention.

BRIEF DESCRIPTION OF THE DRAWINGS

The accompanying drawings illustrate a preferred embodiment of the present invention wherein.

DETAILED DESCRIPTION OF THE INVENTION

Figure 1:
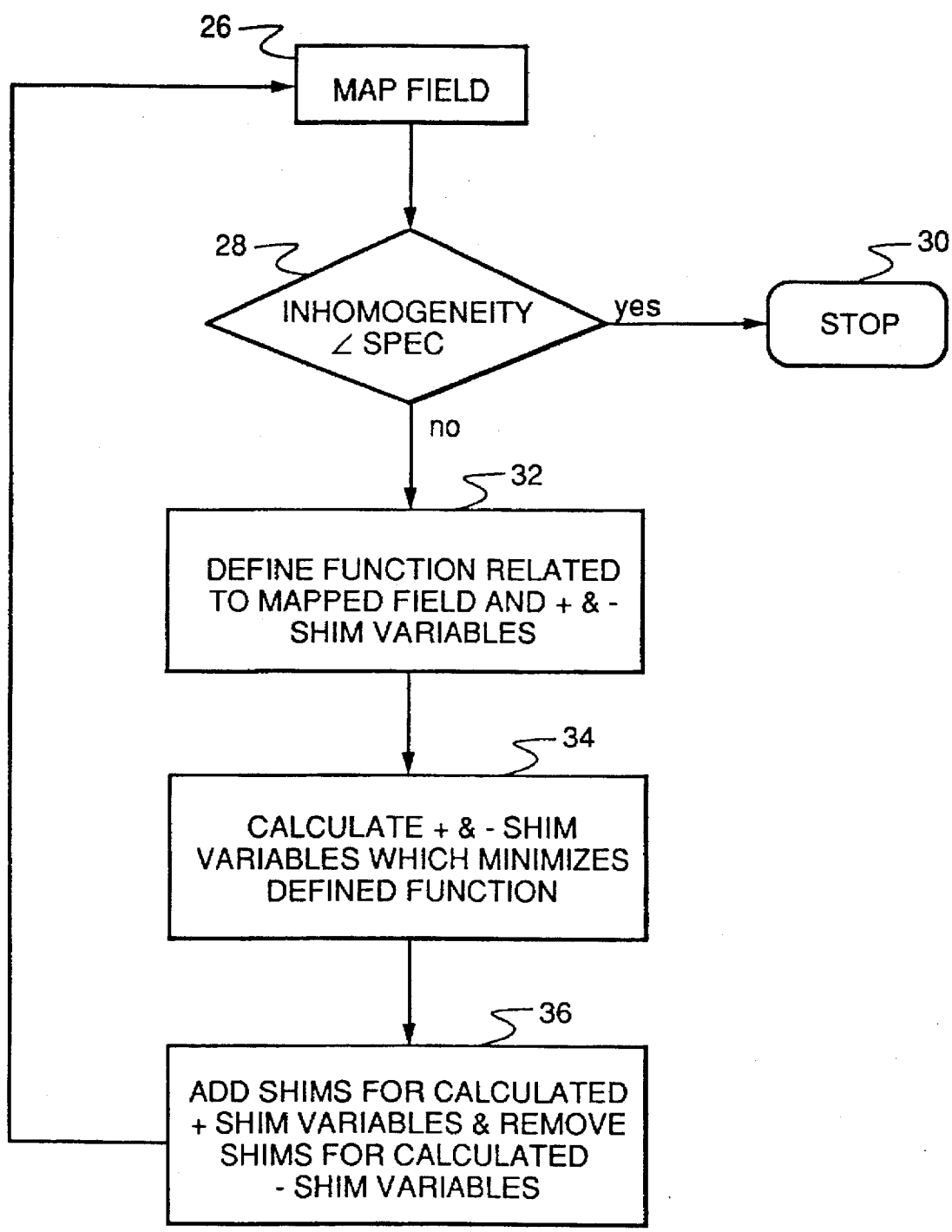
FIG. 1 is a block diagram (flow chart) of a preferred method of the present invention for passively shimming a magnet having a magnetic field with an inhomogeneity and having N possible passive shim locations.

Referring now to the drawings, wherein like numerals represent like elements throughout, FIG. 1 shows in block diagram form a preferred method of the invention for passively shimming a magnet 10 (shown in FIG. 2) having a magnetic field with an inhomogeneity. For purposes of describing the invention, magnet 10 is shown as an open magnet in FIG. 2, and it is noted that, as previously mentioned, an open magnet requires an amount of positive 2,0 Legendre polynomial harmonics for the magnet to be passively shimmed to low levels of inhomogeneity. However, the method of the invention is equally applicable to closed or other types of magnets, as can be appreciated by those skilled in the art. It is further noted that closed and some other types of magnets can be shimmed to low levels of inhomogeneity without having positive 2,0 Legendre polynomial harmonics. In an exemplary embodiment, the magnet 10 is a superconductive magnetic resonance imaging magnet.

Figure 2:
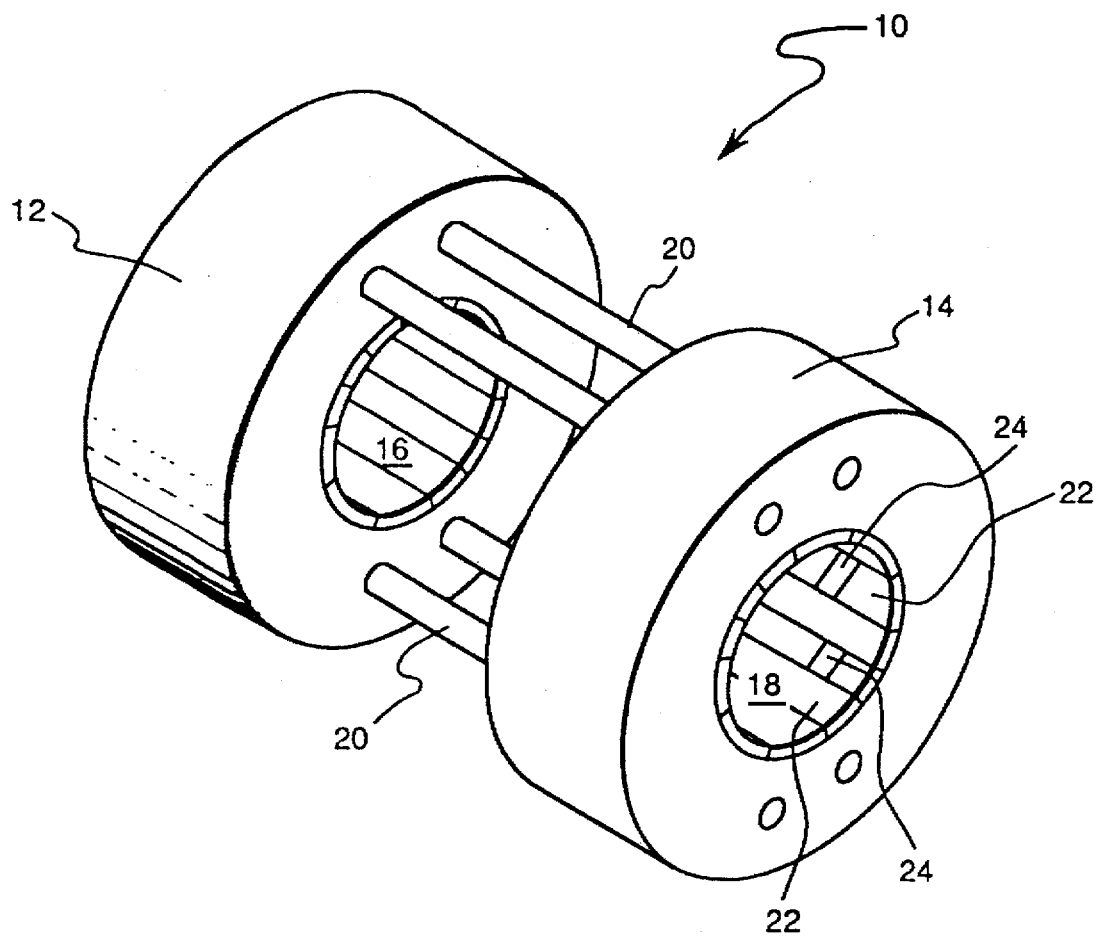
FIG. 2 is a perspective view of a magnet to be passively shimmed by the method shown in FIG. 1.

Preferably, the magnet 10 is a superconductive open magnet having two spaced-apart superconductive coil assemblies 12 and 14 with generally coaxially aligned bores 16 and 18. In an exemplary embodiment, structural posts 20 support the superconductive coil assemblies 12 and 14. In a preferred embodiment, the magnet 10 includes passive shim drawers (trays) 22 containing locations for the attachment of thicknesses of carbon steel passive shims 24 (only two of which are shown in FIG. 2). Preferably, each superconductive coil assembly 12 or 14 has twelve shim drawers 22 which move within rails (not shown), and each shim drawer 22 has eighteen possible passive shim locations. The thickness and location (e.g., the particular position on a particular shim drawer 22 of a particular superconductive coil assembly 12 or 14) of the passive shims 24 needed to reduce the inhomogeneity of the magnetic field to within a predetermined specification is determined by the repetitive passive shimming method of the present invention. In describing the method of the invention, the magnet 10 is considered to have N possible passive shim locations, where N is a number (such as 432).

The preferred method begins with a step portrayed in block 26 of FIG. 1 as "Map Field". This step includes mapping (i.e., measuring) the magnetic field of the magnet 10. Preferably, such mapping is of the magnetic field in the working magnetic field volume, such as in the imaging volume of an MRI magnet. For a typical magnet, the magnetic field at some 314 points is measured. It is noted that the preferred method of the invention may be used alone for shimming the magnet 10, or the preferred method may be used before, during, or after conventional or other shimming techniques have been employed on the magnet 10.

Another step is portrayed in block 28 of FIG. 1 as "Inhomogeneity<Spec". This step includes the substep of calculating the inhomogeneity of the mapped magnetic field of block 26 and the substep of determining if such calculated inhomogeneity is within the predetermined specification. Typically, the inhomogeneity is calculated by subtracting the smallest mapped magnetic field measurement from the largest mapped magnetic field measurement, dividing by the average field (determined from all the measurements), and multiplying by one million to achieve a number representing the peak-to-peak inhomogeneity in parts-per-million (ppm). This step may be skipped the first time through the shimming process. In later repetitions of the shimming method, this step's calculating of the inhomogeneity of the mapped magnetic field would refer to the mapped magnetic field as affected by the positive strengths of passive shims 24 previously added and removed during previous repetitions of the shimming method. If the inhomogeneity is within the predetermined specification, the shimming method is stopped as indicated by block 30 in FIG. 1.

If the inhomogeneity is not within the predetermined specification (or that step was omitted, such as for the first time through the shimming method), a further step is performed which is portrayed in block 32 of FIG. 1 as "Define Function Related To Mapped Field and + & − Shim Variables". This step includes defining a function related to the inhomogeneity of the mapped magnetic field of block 26 as affected by N shim variables each having a positive shim strength and each located at a corresponding one of the N possible passive shim locations and as affected by M shim variables each having a negative shim strength and each located at a corresponding one of the N possible passive shim locations, wherein N is at least equal to M. In a preferred method of the invention, M is the number of occupied passive shim locations having previously-added passive shims 24 out of the N possible passive shim locations, and the M shim variables are each located at a corresponding one of the M occupied passive shim locations. Preferably, the defined function in block 32 is the maximum minus the minimum of an analytical magnetic field equal to the mapped magnetic field of block 26 as affected by the N and M shim variables. Another preferred defined function for block 32 includes the sum of the squares of such analytical magnetic field, the sum to be taken over all of the magnetic field measurement points.

Another step is portrayed in block 34 of FIG. 1 as "Calculate + & − Shim Variables Which Minimizes Defined Function". This step includes running a computer optimization code which calculates the positive strengths of the N shim variables and the negative strengths of the M shim variables which minimizes the defined function of block 32. Preferably, the computer optimization code uses a conventional optimization algorithm such as a least squares technique, linear programming, and the like, as is known to those skilled in the art. In an exemplary method, the peak-to-peak inhomogeneity is minimized over all of the magnetic field measurement points subject to two constraints. One constraint is that, over all of the magnetic field measurement points, the previously described analytical magnetic field minus the average mapped magnetic field is less than or equal to half the peak-to-peak inhomogeneity. The other constraint is that, over all of the magnetic field measurement points, the previously described analytical magnetic field minus the average mapped magnetic field is greater than or equal to half the negative value of the peak-to-peak inhomogeneity.

Next, an additional step is performed which is portrayed in block 36 of FIG. 1 as "Add Shims For Calculated+Shim Variables & Remove Shims For Calculated−Shim Variables". This step includes adding to the magnet 10 positive strengths of passive shims 24 corresponding to the positive strengths of the N shim variables calculated from block 34 and removing from the magnet 10 positive strengths of passive shims 24 corresponding to the negative strengths of the M shim variables calculated from block 34. It is understood that previously-added passive shims 24 have positive shim strengths and that the absolute value of the negative strength of any of the M shim variables calculated from block 34 is not greater than the positive shim strength of the corresponding (i.e., identically-located) one of the previously-added passive shims 24. From block 36, the shimming method is repeated by going again to block 26. Such repetitions of the steps of the method stop with block 30 when the calculated inhomogeneity of block 28 is within the predetermined specification.

Preferably, between blocks 34 and 36, another step of the method is performed which subtracts the calculated negative strengths of the M shim variables from the calculated positive strengths of the N shim variables for identical passive shim locations. In an exemplary method, the passive shims 24 are identical to each other differing only in thickness. In the defined function of block 32, it is preferred that the positive shim strengths of the N shim variables are expressed in terms of positive shim thicknesses and that the negative shim strengths of the M shim variables are expressed in terms of negative shim thicknesses, as can be appreciated by those skilled in the art. In an exemplary method, that part of the defined function of block 32 relating to the effect of the N and M shim variables on the mapped magnetic field of block 26 at a particular magnetic field measuring location is determined as follows. A particular shim variable is set equal to a corresponding unit shim times a corresponding coefficient. The unit shim is the experimentally or analytically determined effect of a unit-thickness passive shim on the mapped magnetic field of block 26 at the particular magnetic field measuring location. The corresponding coefficient is the unknown (positive or negative) thickness of the unit shim which is to be determined in block 34.

In an alternate method of the invention, M equals N in block 32, and block 34 is performed with the constraint that each of the M shim variables corresponding to a vacant passive shim location devoid of a previously-added passive shim 24 must be set equal to zero.

It is noted that if an open magnet requires additional positive 2,0 Legendre polynomial harmonics to be shimmed to lower levels of inhomogeneity, such additional positive 2,0 Legendre polynomial harmonics preferably are created by increasing the separation between the two superconductive coil assemblies 12 and 14 or by adding full shim drawers 22 and removing some shims 24, as is within the purview of those skilled in the art. It is further noted that when repeating block 26 of the method, the magnetic field to be mapped is the magnetic field of the magnet 10 as affected by the previously added and removed shims 24 of block 36. It is pointed out that a closed magnet can be derived from the open magnet of FIG. 2 by considering the magnet 10 to have only a single coil assembly 12 whose bore 16 contains the working magnetic field volume, as can be appreciated by those skilled in the art.

The foregoing description of a preferred embodiment of the invention has been presented for purposes of illustration. It is not intended to be exhaustive or to limit the invention to the precise form disclosed, and obviously many modifications and variations are possible in light of the above teaching. For example, the magnet 10 can be of a type other than a closed or open magnet. For example, a "C"-shaped magnet can be passively shimmed by adding and removing passive shims from the magnet's pole faces in accordance with the method of the invention, as can be understood by those skilled in the art. It is intended that the scope of the invention be defined by the claims appended hereto.

I claim:

1. A method for passively shimming a magnet having a magnetic field with an inhomogeneity and having N possible passive shim locations, said method comprising the steps of:

(a) mapping the magnetic field;

(b) defining a function related to said inhomogeneity of said mapped magnetic field of step (a) as affected by N shim variables each having a positive shim strength and each located at a corresponding one of said N possible passive shim locations and as affected by M shim variables each having a negative shim strength and each located at a corresponding one of said N possible passive shim locations, wherein N is at least equal to M;

(c) running a computer optimization code which uses linear programming to calculate the positive strengths of said N shim variables and the negative strengths of said M shim variables which minimizes said defined function; and (d) adding to said magnet positive strengths of passive shims corresponding to said positive strengths of said N shim variables calculated from step (c) and removing from said magnet positive strengths of passive shims corresponding to said negative strengths of said M shim variables calculated from step (c).

2. The method of claim 1, wherein M equals N in step (b), and wherein step (c) is performed with the constraint that each of the M shim variables corresponding to a vacant passive shim location devoid of a previously-added passive shim must be set equal to zero.

3. The method of claim 1, wherein M is the number of occupied passive shim locations having previously-added passive shims out of said N possible passive shim locations, and wherein said M shim variables are each located at a corresponding one of said M occupied passive shim locations.

4. The method of claim 3, wherein said previously-added passive shims have positive shim strengths, and wherein the absolute value of the negative strength of any of said M shim variables calculated from step (c) is not greater than the positive shim strength of the corresponding one of said previously-added passive shims.

5. The magnet of claim 1, wherein said function defined in step (c) to be minimized in step (c) is the maximum minus the minimum of an analytical magnetic field equal to said mapped magnetic field of step (a) as affected by said N and M shim variables.

6. The method of claim 1, wherein said magnet is a superconductive magnetic resonance imaging magnet.

7. The method of claim 1, wherein said negative shim strengths of said M shim variables are expressed in terms of negative shim thicknesses.

8. The method of claim 1, also including between steps (c) and (d) the step of subtracting said calculated negative strengths of said M shim variables from said calculated positive strengths of said N shim variables for identical passive shim locations.

9. The method of claim 1, also including between steps (a) and (b) the steps of calculating the inhomogeneity of said mapped magnetic field of step (a) and determining if said calculated inhomogeneity is within a predetermined specification.

10. The method of claim 9, also including repeating all of said steps of said method until said calculated inhomogeneity is within said predetermined specification.

* * * * *